United States Patent
Hwang

(10) Patent No.: US 11,855,596 B2
(45) Date of Patent: Dec. 26, 2023

(54) SEMICONDUCTOR INTEGRATED CIRCUIT DEVICE

(71) Applicant: SK hynix Inc., Icheon-si (KR)

(72) Inventor: Kyu Dong Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 484 days.

(21) Appl. No.: 17/175,504

(22) Filed: Feb. 12, 2021

(65) Prior Publication Data

US 2021/0167742 A1 Jun. 3, 2021

Related U.S. Application Data

(63) Continuation of application No. 16/368,142, filed on Mar. 28, 2019.

(30) Foreign Application Priority Data

Jun. 18, 2018 (KR) .......................... 10-2018-0069535

(51) Int. Cl.
 *H03F 3/45* (2006.01)
(52) U.S. Cl.
 CPC ................. *H03F 3/45179* (2013.01)
(58) Field of Classification Search
 CPC ............................................. H03F 3/45
 USPC ................................................ 330/253, 257
 See application file for complete search history.

(56) References Cited

U.S. PATENT DOCUMENTS

| | | | |
|---|---|---|---|
| 5,182,526 A * | 1/1993 | Nelson | H03F 1/083 323/280 |
| 6,028,480 A | 2/2000 | Seevinck et al. | |
| 6,703,898 B2 * | 3/2004 | Renous | H03F 1/086 330/253 |
| 8,629,726 B1 | 1/2014 | Madison | |
| 8,884,690 B2 | 11/2014 | Pan et al. | |
| 2004/0008086 A1 | 1/2004 | Sanchez et al. | |
| 2010/0148871 A1 | 6/2010 | Lee et al. | |
| 2011/0074510 A1 | 3/2011 | Amirabadi | |
| 2015/0288338 A1 | 10/2015 | Liu et al. | |
| 2016/0072449 A1 | 3/2016 | Tajalli | |
| 2017/0148495 A1 | 5/2017 | Takai | |

(Continued)

FOREIGN PATENT DOCUMENTS

| | | |
|---|---|---|
| CN | 106059511 A | 10/2016 |
| CN | 106468932 A | 3/2017 |
| KR | 1020070115054 A | 12/2007 |

(Continued)

*Primary Examiner* — Henry Choe
(74) *Attorney, Agent, or Firm* — WILLIAM PARK & ASSOCIATES LTD.

(57) ABSTRACT

An amplifier circuit includes a first input unit, a second input unit, a first current supply unit, and a second current supply unit. The first input unit changes a voltage level of a first output node based on a first input signal. The second input unit changes a voltage level of a second output node based on a second input signal. The first current supply unit supplies a first current to the first output node based on a voltage level of the first output node and boosts the voltage level of the first output node for a predetermined time when the voltage level of the first output node is changed. The second current supply unit supplies a second current to the second output node based on the voltage level of the first output node.

12 Claims, 6 Drawing Sheets

(56) References Cited

U.S. PATENT DOCUMENTS

2017/0373654 A1  12/2017  Pasotti et al.

FOREIGN PATENT DOCUMENTS

KR  101125493 B1  3/2012
TW  I405404 B  8/2013

* cited by examiner

SEMICONDUCTOR INTEGRATED CIRCUIT DEVICE

CROSS-REFERENCES TO RELATED APPLICATION

The present application is a continuation application of U.S. Ser. No. 16/368,142, filed on Mar. 28, 2019, and claims priority under 35 U.S.C. § 119(a) to Korean application number 10-2018-0069535, filed on Jun. 18, 2018, in the Korean Intellectual Property Office, which is incorporated herein by reference in its entirety.

BACKGROUND

1. Technical Field

Various embodiments may generally relate to integrated circuit technology, and more particularly, to an amplifier circuit and a semiconductor apparatus and a semiconductor system employing the same.

2. Related Art

Electronic devices may include various electronic elements and computer systems, such as a personal computer (PC), a tablet PC, a laptop computer, and a smart phone, may include many semiconductor apparatuses configured from semiconductors. The semiconductor apparatuses constituting computer systems may communicate with each other by transmitting and receiving clock signals and data therebetween. The semiconductor apparatuses may include amplifier circuits to receive signals transmitted from external apparatuses or receive signals between internal circuits of the semiconductor apparatuses. The amplifier circuits may typically receive a differential signal pair or a single-ended signal by performing a differential amplification operation. The amplifier circuits may perform differential amplification on differential signals having complementary levels or perform differential amplification on the single-ended signal and a reference voltage.

As the performance of semiconductor apparatuses are improved and high-speed communication is performed, frequencies of the clock signals used in the semiconductor systems are continuously increased and amplitudes of signals transmitted between the semiconductor apparatuses are gradually reduced. To ensure the accurate communication between the semiconductor apparatuses, the signals having the reduced amplitudes need to be amplified accurately. Accordingly, amplifier circuits suitable for high-speed communication and improved interface circuits have been studied.

SUMMARY

In an embodiment of the present disclosure, an amplifier circuit includes a first input unit configured to change a voltage level of a first output node based on a first input signal. The amplifier circuit also includes a second input unit configured to change a voltage level of a second output node based on a second input signal. The amplifier circuit further includes a first current supply unit configured to supply a first current to the first output node based on the voltage level of the first output node and boost the voltage level of the first output node for a predetermined time when the voltage level of the first output node is changed. The amplifier circuit additionally includes a second current supply unit configured to supply a second current to the second output node based on the voltage level of the first output node. An output signal may be output from the second output node.

In another embodiment of the present disclosure, an amplifier circuit includes a first input unit configured to change a voltage level of a first output node based on a first input signal. The amplifier circuit also includes a second input unit configured to change a voltage level of a second output node based on a second input signal. The amplifier circuit further includes a first current driver configured to supply a first current to the first output node based on a voltage level of a boosting node. The amplifier circuit additionally includes a gain booster configured to change the voltage level of the boosting node based on the voltage level of the first output node and to change the voltage level of the boosting node after a predetermined time when the voltage level of the first output node is changed. The amplifier circuit also includes a second current driver configured to supply a second current to the second output node based on the voltage level of the first output node. An output signal may be output from the second output node.

In another embodiment of the present disclosure, an amplifier circuit includes a first current transistor configured to supply a first power voltage to a first output node based on a voltage level of a boosting node. The amplifier circuit also includes a resistor element coupled between the first output node and the boosting node. The amplifier circuit further includes a second current transistor configured to supply the first power voltage to a second output node based on a voltage level of the first output node. The amplifier circuit additionally includes a first input transistor configured to form a current path between the first output node and a second power voltage terminal based on a first input signal. The amplifier circuit also includes a second input transistor configured to form a current path between the second output node and the second power voltage terminal based on a second input signal. An output signal may be output from the second output node.

BRIEF DESCRIPTION OF THE DRAWINGS

The above and other aspects, features, and advantages of the subject matter of the present disclosure will be more clearly understood from the following detailed description taken in conjunction with the accompanying drawings.

DETAILED DESCRIPTION

Various embodiments of the present invention are described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configuration and shape which do not depart from the spirit and scope of the present invention as defined in the appended claims.

The present invention is described herein with reference to cross-section and/or plan illustrations of idealized embodiments of the present invention. However, embodiments of the present invention should not be construed as being so limited. Although a few embodiments of the present invention are shown and described, it will be appreciated by those of ordinary skill in the art that changes may be made in these embodiments without departing from the principles and spirit of the present invention.

Embodiments are provided to an amplifier circuit capable of boosting a voltage level of an output signal by increasing a gain of the amplifier circuit when a level of an input signal is changed and a semiconductor apparatus and a semiconductor system employing the same. According to embodiments, communication with high speed and low power in a semiconductor apparatus and a semiconductor system may be enabled.

Figure 1:
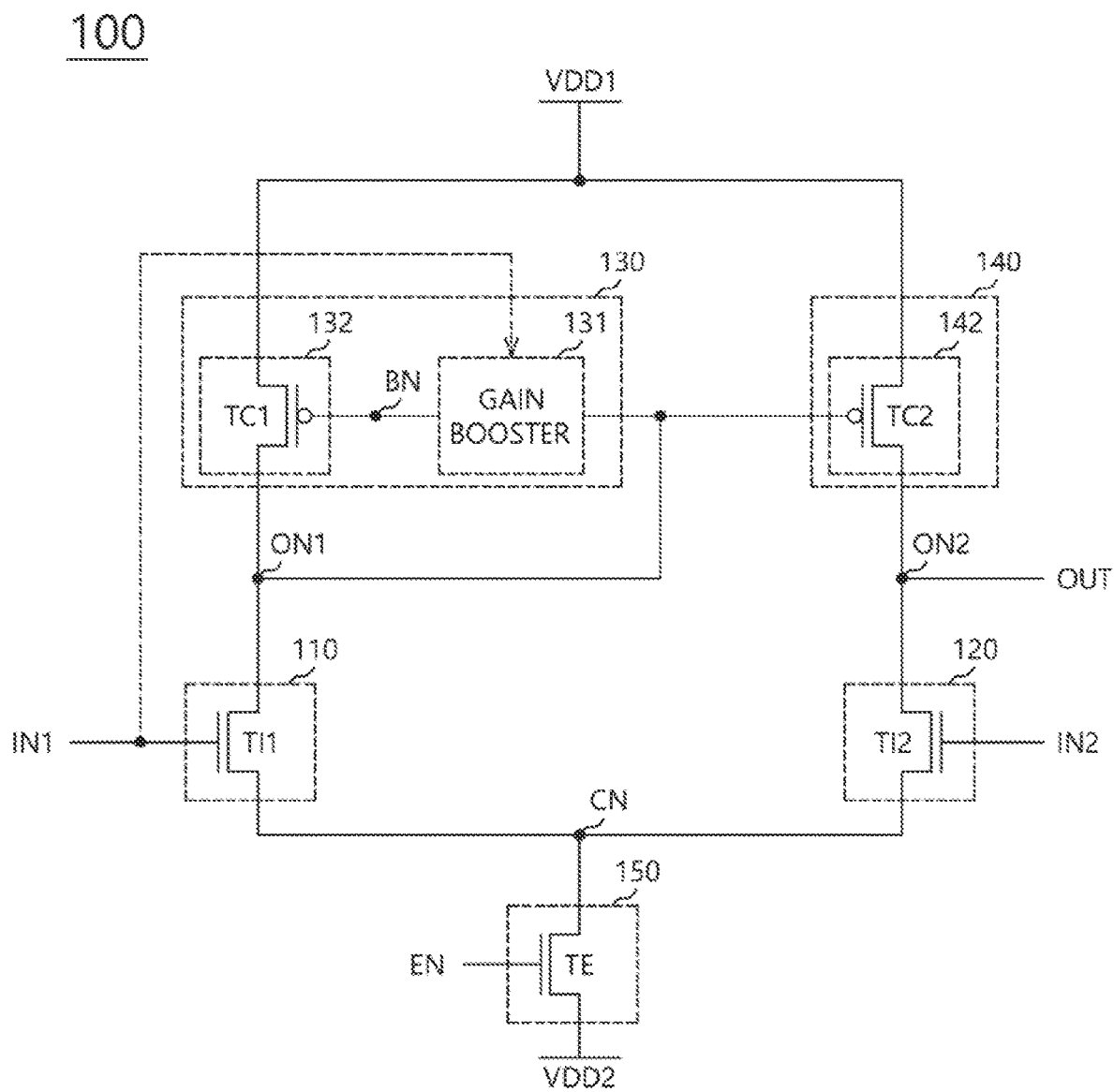
FIG. 1 shows a diagram illustrating a configuration of an amplifier circuit, according to an embodiment of the present disclosure.

FIG. 1 shows a diagram illustrating a configuration of an amplifier circuit 100 according to an embodiment. Referring to FIG. 1, the amplifier circuit 100 may generate an output signal OUT by receiving a first input signal IN1 and a second input signal IN2. The amplifier circuit 100 may generate the output signal OUT by performing differential amplification on the first and second input signals IN1 and IN2. The amplifier circuit 100 may perform a differential amplifier operation by receiving a first power voltage VDD1 and a second power voltage VDD2. The first power voltage VDD1 may have a higher voltage level than the second power voltage VDD2. The second input signal IN2 may be a complementary signal of the first input signal IN1. For example, the second input signal IN2 may have an opposite level to the first input signal IN1. In an embodiment, the second input signal IN2 may be a reference voltage. The reference voltage may have a voltage level corresponding to a middle level of a swing range of the first input signal IN1. The amplifier circuit 100 may boost a voltage level of the output signal OUT when the voltage level of the first input signal IN1 is changed. The amplifier circuit 100 may boost the voltage level of the output signal OUT by increasing an alternating current (AC) gain when the voltage level of the first input signal IN1 is changed. Accordingly, the amplifier circuit 100 may generate an accurate output signal OUT even when the first and second input signals IN1 and IN2 have small amplitudes.

Referring to FIG. 1, the amplifier circuit 100 may include a first input unit 110, a second input unit 120, a first current supply unit 130, and a second current supply unit 140. The first input unit 110 may receive the first input signal IN1. The first input unit 110 may change a voltage level of a first output node ON1 based on the first input signal IN1. The first input unit 110 may change the voltage level of the first output node ON1 by forming a current path between the first output node ON1 and a second power voltage VDD2 terminal based on the first input signal IN1. The second input unit 120 may receive the second input signal IN2. The second input unit 120 may change the voltage level of the second output node ON2 based on the second input signal IN2. The second input unit 120 may change the voltage level of the second output node ON2 by forming a current path between the second output node ON2 and the second power voltage VDD2 terminal based on the second input signal IN2. The output signal OUT may be output from the second output node ON2.

The first current supply unit 130 may supply a current to the first output node ON1 based on the voltage level of the first output node ON1. For example, the current to the first output node ON1 may be a first current. The first current supply unit 130 may supply the current to the first output node ON1 from a first power voltage VDD1 terminal based on the voltage level of the first output node ON1. The first current supply unit 130 may control an amount of current supplied to the first output node ON1 according to the voltage level of the first output node ON1. The first current supply unit 130 may boost the voltage level of the first output node ON1 for a predetermined time when the voltage level of the first output node ON1 is changed. The first current supply unit 130 may boost the voltage level of the first output node ON1 by maintaining the amount of current supplied to the first output node ON1 for the predetermined time even when the voltage level of the first output node ON1 is changed. The first current supply unit 130 may change the amount of current supplied to the first output node ON1 according to the voltage level of the first output node ON1 after the predetermined time. In an embodiment, the first current supply unit 130 may selectively receive the first input signal IN1. When the first input signal IN1 is provided to the first current supply unit 139, the first current supply unit 130 may supply the current to the first output node ON1 based on the first input signal IN1 and the voltage level of the first output node ON1.

The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The first current supply unit 130 may include a gain booster 131 and a first current driver 132. The gain booster 131 may be coupled between the first output node ON1 and a boosting node BN. The gain booster 131 may change a voltage level of the boosting node BN based on the voltage level of the first output node ON1. The gain booster 131 may allow the voltage level of the booster node BN to be changed after the predetermined time when the voltage level of the first output node ON1 is changed. In an embodiment, the gain booster 131 may selectively receive the first input signal IN1 and change the voltage level of the boosting node BN based on the first input signal IN1 and the voltage level of the first output node ON1. The gain booster 131 may further boost the voltage level of the first output node ON1 by changing the voltage level of the boosting node BN based on the first input signal IN1 when the voltage level of the first output node ON1 is changed. The gain booster 131 may boost the voltage level of the boosting node BN when the level of the first input signal IN1 is changed. The first current driver 132 may supply the current to the first output node ON1 based on the voltage level of the boosting node BN. The first current driver 132 may control the amount of current supplied to the first output node ON1 by supplying the first power voltage VDD1 to the first output node ON1 based on the voltage level of the boosting node BN.

The second current supply unit 140 may supply a current to the second output node ON2 based on the voltage level of the first output node ON1. For example, the current to the second output node ON2 may be a second current. The second current supply unit 140 may supply the current to the second output node ON2 from the first power voltage VDD1 terminal based on the voltage level of the first output node ON1. The second current supply unit 140 may include a second current driver 142. The second current driver 142 may supply the current to the second output node ON2 based on the voltage level of the first output node ON1. The second current driver 142 may control an amount of current supplied to the second output node ON2 by supplying the first power voltage VDD1 to the second output node ON2 based on the voltage level of the first output node ON1.

The amplifier circuit 100 may further include an enable unit 150. The enable unit 150 may be coupled between the first and second input units 110 and 120 and the second power voltage VDD2 terminal. The enable unit 150 may allow the first and second input units 110 and 120 to be coupled to the second power voltage VDD2 terminal based on an enable signal EN. The enable signal EN may be a signal input to activate the amplifier circuit 100 and may be a bias voltage having an arbitrary level.

Referring to FIG. 1, the first input unit 110 may include a first input transistor TI1. For example, the first input transistor TI1 may be an N-channel MOS transistor. A gate of the first input transistor TI1 may receive the first input signal IN1, a drain thereof may be coupled to the first output node ON1, and a source thereof may be coupled to a common node CN. The common node CN may be coupled to the second power voltage VDD2 terminal through the enable unit 150. The first input transistor TI1 may change the voltage level of the first output node ON1 by forming a current path between the first output node ON1 and the second power voltage VDD2 terminal based on the first input signal IN1.

The second input unit 120 may include a second input transistor TI2. For example, the second input transistor TI2 may be an N-channel MOS transistor. A gate of the second input transistor TI2 may receive the second input signal IN2, a drain thereof may be coupled to the second output node ON2, and a source thereof may be coupled to the common node CN. The second input transistor TI2 may change the voltage level of the second output node ON2 by forming the current path between the second output node ON2 and the second power voltage VDD2 terminal based on the second input signal IN2.

The first current driver 132 may include a first current transistor TC1. For example, the first current transistor TC1 may be a P channel MOS transistor. A gate of the first current transistor TC1 may be coupled to the boosting node BN, a source thereof may be coupled to the first power voltage VDD1 terminal, and a drain thereof may be coupled to the first output node ON1. The first current transistor TC1 may supply the current to the first output node ON1 by forming a current path between the first power voltage VDD1 terminal and the first output node ON1 based on the voltage level of the boosting node BN.

The second current driver 142 may include a second current transistor TC2. For example, the second current transistor TC2 may be a P channel MOS transistor. A gate of the second current transistor TC2 may be coupled to the first output node ON1, a source thereof may be coupled to the first power voltage VDD1 terminal, and a drain thereof may be coupled to the second output node ON2. The second current transistor TC2 may supply the current to the second output node ON2 by forming a current path between the first power voltage VDD1 terminal and the second output node ON2 based on the voltage level of the first output node ON1.

The enable unit 150 may include an enable transistor TE. For example, the enable transistor TE may be an N channel MOS transistor. A gate of the enable transistor TE may receive the enable signal EN, a drain thereof may be coupled to the common node CN, and a source thereof may be coupled to the second power voltage VDD2 terminal. In an embodiment, the second power voltage VDD2 may be modified to have a higher level than the first power voltage VDD1, the first and second input transistors TI1 and TI2 may be modified to P channel MOS transistors, and the first and second current transistors TC1 and TC2 may be modified to N channel MOS transistors.

Figure 2A:
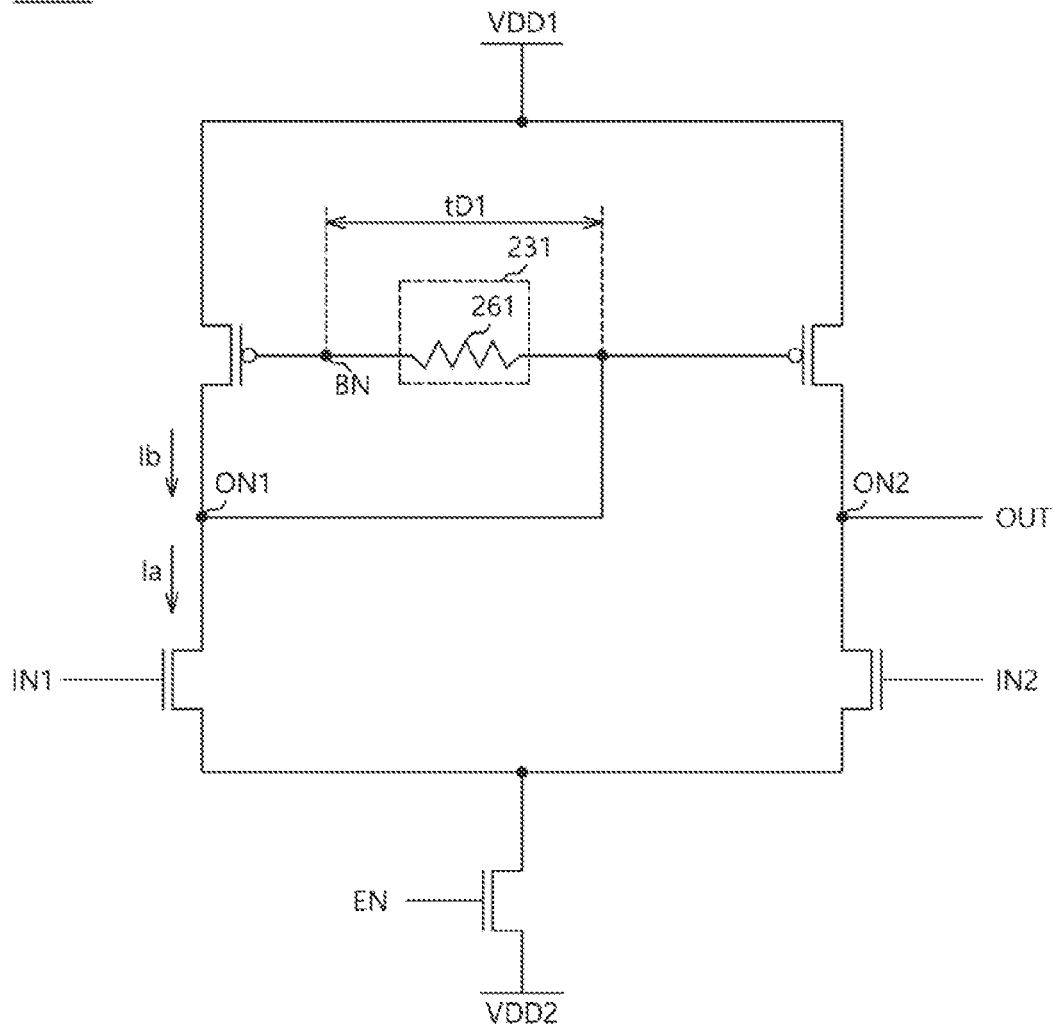
FIG. 2A shows a diagram illustrating a configuration of an amplifier circuit, according to an embodiment of the present disclosure.

FIG. 2A shows a diagram illustrating a configuration of an amplifier circuit 200, according to an embodiment. The amplifier circuit 200 may include elements corresponding to the amplifier circuit 100 illustrated in FIG. 1. Redundant descriptions for similar elements are omitted. A gain booster 231 of the amplifier circuit 200 may include a delay unit 261. The delay unit 261 may be coupled between the first output node ON1 and the boosting node BN. The delay unit 261 may allow the voltage level of the boosting node BN to be changed according to the voltage level of the first output node ON1 after a predetermined time tD1 even when the voltage level of the first output node ON1 is changed. The delay time by the delay unit 261 may correspond to the predetermined time tD1. The delay unit 261 may include a resistor element coupled between the first output node ON1 and the boosting node BN.

Figure 2B:
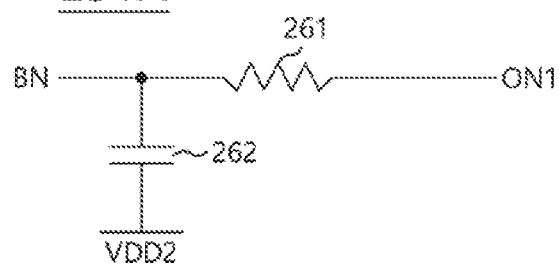
FIG. 2B shows a circuit diagram of a gain booster according to an embodiment of the present disclosure.

FIG. 2B shows a circuit diagram of a gain booster 231A, according to an embodiment. Referring to FIG. 2B, the gain booster 231A may include a delay unit 261 and a capacitor 262. As above, the delay unit 261 may be coupled between the first output node ON1 and the boosting node BN. The capacitor may be coupled between a node, positioned between the delaying unit 261 and the boosting node BN, and the second power voltage VDD2 terminal. The capacitor 262 may control a delaying amount of the gain booster 231A. For example, the capacitor 262 may boost the voltage level of the boosting node BN based on the voltage level of the second power voltage VDD2.

Figure 3:
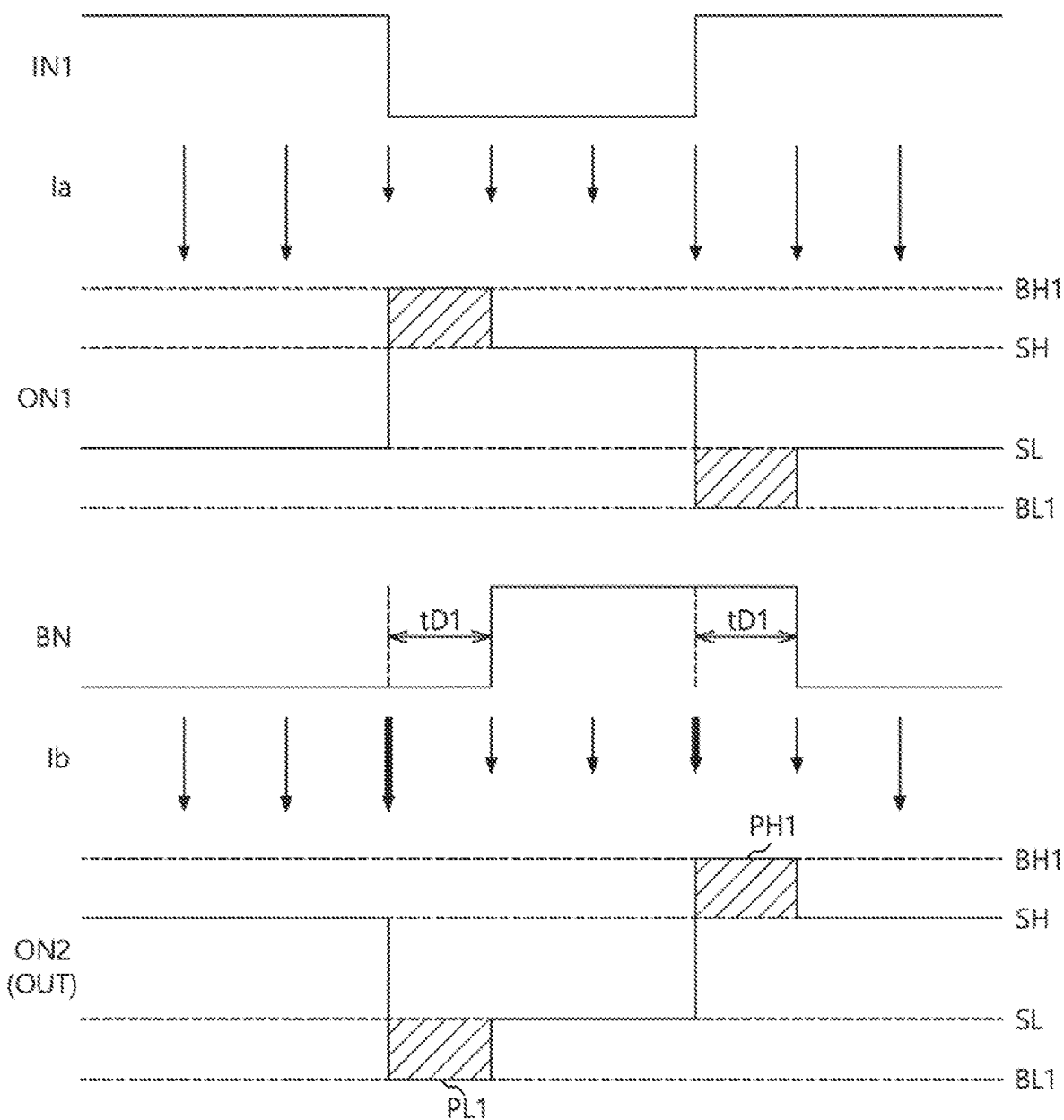
FIG. 3 shows a timing diagram illustrating an operation of an amplifier circuit, according to an embodiment of the present disclosure.

FIG. 3 shows a timing diagram illustrating an operation of the amplifier circuit 200 illustrated in FIG. 2. The operation of the amplifier circuit 200, according to an embodiment, is described below with reference to FIGS. 1 to 3. For FIG. 3, it is assumed that a current flowing from the first output node ON1 to the second power voltage VDD2 terminal through the first input unit 110 is a third current Ia and a current flowing from the first power voltage VDD1 terminal to the first output node ON1 through the first current supply unit 130 is a fourth current Ib. For example, the fourth current Ib may be substantially same with the first current. During a steady state when the first input signal IN1 is maintained at a high level, the voltage level of the first output node ON1 may be a steady state low level SL and the voltage level of the second output node ON2 may be a steady state high level SH. Because the voltage level of the first input signal IN1 is the steady state, the voltage levels of the first output node ON1 and the boosting node BN may also be the steady state. Accordingly, an amount of the third current Ia and an amount of the fourth current Ib may be an equilibrium state and the voltage level of the first output node ON1 may be maintained at the steady state low level SL. Because the second input signal IN2 has an opposite level to the first input signal IN1, the second output node ON2 may be maintained at the steady state high level SH and the output signal OUT of a high level may be generated.

When the first input signal IN1 is changed from a high level to a low level, the amount of the third current Ia may be reduced and the voltage level of the first output node ON1 may be increased, for example, to the steady state high level SH. At this time, the voltage level of the boosting node BN might not be changed by the delay unit 261 for the predetermined time tD1. Accordingly, as the amount of the third current Ia is reduced, but the amount of the fourth current Ib is maintained as indicated by a bolded arrow, the voltage level of the first output node ON1 may be boosted to a first boosting high level BH1. When the voltage level of the boosting node BN is changed to the high level according to the voltage level of the first output node ON1 after the predetermined time tD1, the amount of the third current Ia and the amount of the fourth current Ib may be the equilibrium state again and the voltage level of the first output node ON1 may be the steady state high level SH. As the voltage level of the first output node ON1 is boosted, the voltage level of the second output node ON2 may also be boosted to a first boosting low level BL1 and the output signal OUT having a low level peak PL1 may be generated.

When the first input signal IN1 is changed from the low level to the high level, the amount of the third current Ia may be increased and the voltage level of the first output node ON1 may be dropped, for example, to the steady state low level SL. At this time, the voltage level of the boosting node BN might not be changed for the predetermined time tD1 by the delay unit 261. Accordingly, because the amount of the third current Ia is increased, but the amount of the fourth current Ib is maintained, as indicated by a bolded arrow, the voltage level of the first output node ON1 may be boosted to the first boosting low level BL1. When the voltage level of the boosting node BN is changed to the low level according to the voltage level of the first output node ON1 after the predetermined time tD1, the amount of the third current Ia and the amount of the fourth current Ib may be the equilibrium state again and the voltage level of the first output node ON1 may be the steady state low level SL. As the voltage level of the first output node ON1 is boosted, the voltage level of the second output node ON2 may also be boosted to the first boosting high level BH1 and the output signal OUT having a high level peak PH1 may be generated.

Figure 4:
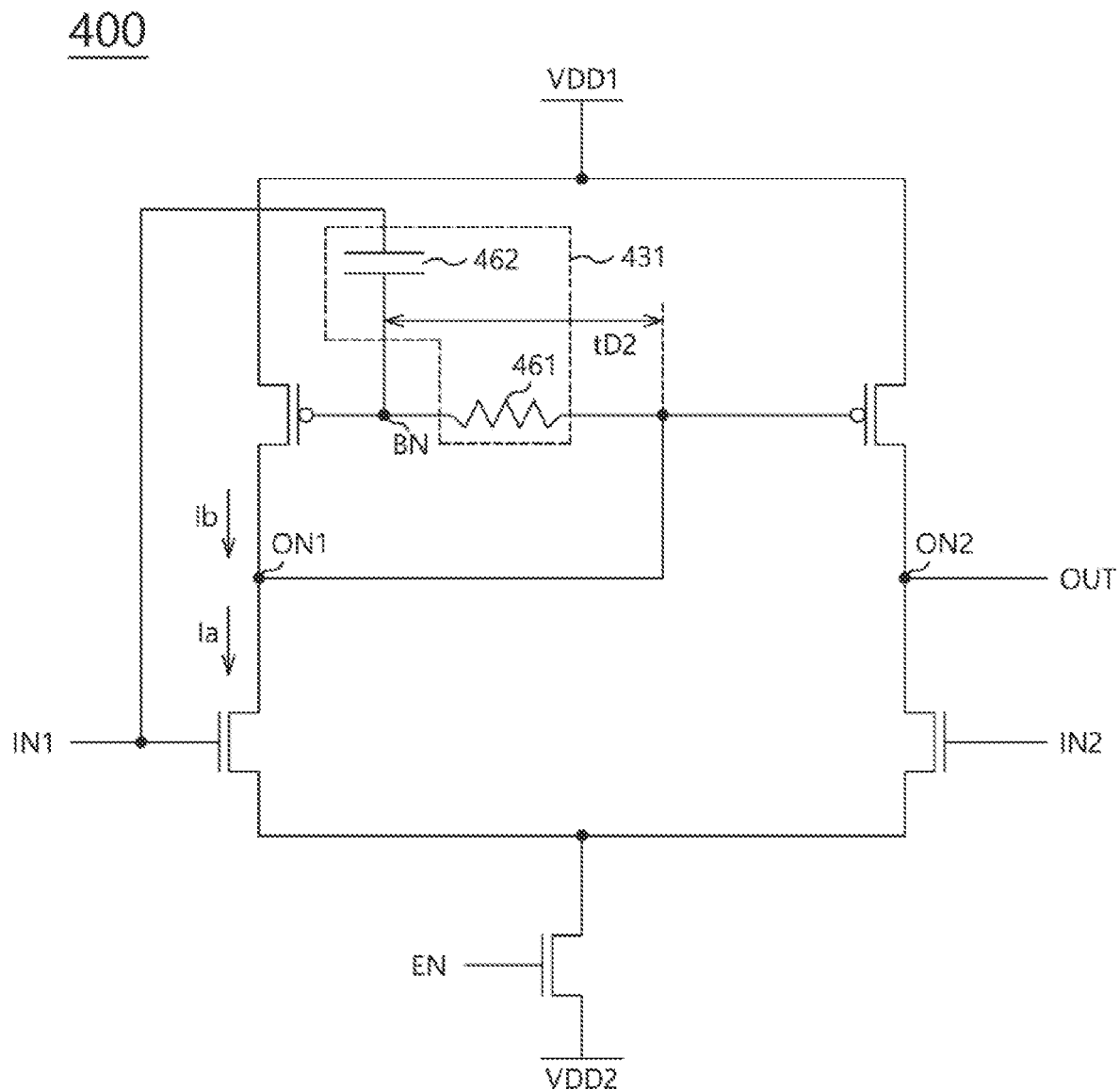
FIG. 4 shows a diagram illustrating a configuration of an amplifier circuit, according to an embodiment of the present disclosure.

FIG. 4 shows a diagram illustrating a configuration of an amplifier circuit 400, according to an embodiment. The amplifier circuit 400 may include elements corresponding to elements of the amplifier circuit 100 illustrated in FIG. 1. Redundant descriptions for similar elements are omitted. A gain booster 431 of the amplifier circuit 400 may include a delay unit 461 and a capacitor 462. The delay unit 461 may be coupled between the first output node ON1 and the boosting node BN. The delay unit 461 may allow the voltage level of the boosting node BN to be changed according to the voltage level of the first output node ON1 after a predetermined time tD2 even when the voltage level of the first output node ON1 is changed. The delay unit 461 may include a resistor element coupled between the first output node ON1 and the boosting node BN. The capacitor 462 may receive the first input signal IN1. One terminal of the capacitor 462 may receive the first input signal IN1 and the other terminal of the capacitor 462 may be coupled to the boosting node BN. The capacitor 462 may boost the voltage level of the boosting node BN based on the voltage level of the first input signal IN1. The capacitor 462 may boost the voltage level of the boosting node BN to the high or low level when the voltage level of the first input signal IN1 is changed. For example, the capacitor 462 may boost the boosting node BN to the low level when the first input signal IN1 is changed from the high level to the low level and boost the boosting node BN to the high level when the first input signal IN1 is changed from the low level to the high level. The delay time by the delay unit 461 and the capacitor 462 may correspond to the predetermined time tD2.

Figure 5:
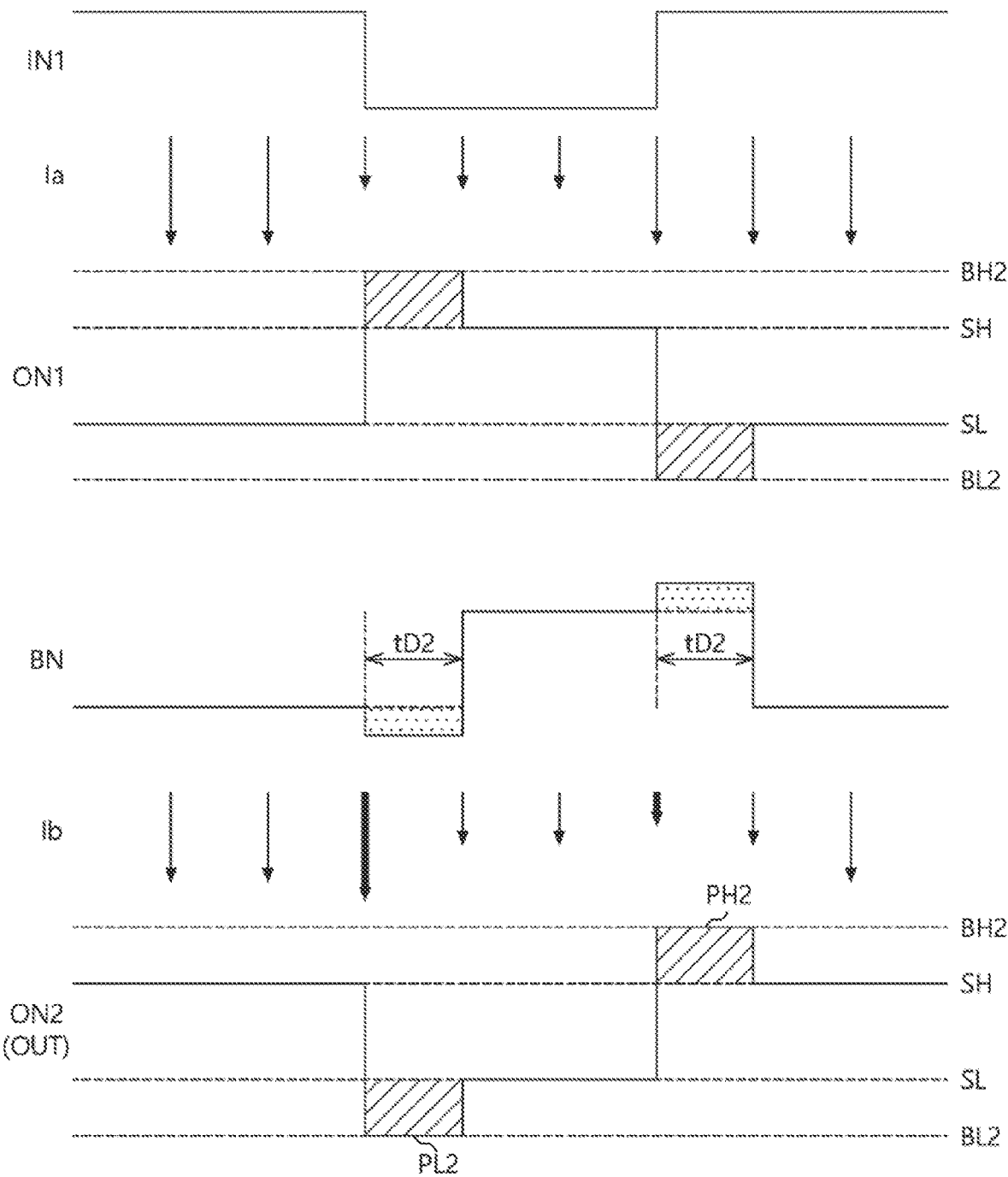
FIG. 5 shows a timing diagram illustrating an operation of an amplifier circuit, according to an embodiment of the present disclosure.

FIG. 5 shows a timing diagram illustrating an operation of the amplifier circuit 400 illustrated in FIG. 4. The operation of the amplifier circuit 400, according to an embodiment, is described below with reference to FIGS. 1, 4, and 5. In FIG. 5, it is assumed that a current flowing from the first output node ON1 to the second power voltage VDD2 terminal through the first input unit 110 is a third current Ia and a current flowing from the first power voltage VDD1 terminal to the first output node ON1 through the first current supply unit 130 is a fourth current Ib. During a steady state when the first input signal IN1 is maintained at the high level, the voltage level of the first output node ON1 may be the steady state low level SL and the voltage level of the second output node ON2 may be the steady state high level SH. Because the voltage level of the first input signal IN1 is the steady state, the voltage levels of the first output node ON1 and the boosting node BN may also be the steady state. Accordingly, an amount of the third current Ia and an amount of the fourth current Ib may be the equilibrium state and the voltage level of the first output node ON1 may be maintained at the steady state low level SL. Because the second input signal IN2 has an opposite level to the first input signal IN1, the second output node ON2 may be maintained at the steady state high level SH and the output signal OUT of the high level may be generated.

When the first input signal IN1 is changed from the high level to the low level, the amount of the third current Ia may be reduced and the voltage level of the first output node ON1 may be increased, for example, to the steady state high level SH. At this time, the capacitor 462 may boost the voltage level of the boosting node BN to the low level according to the level change of the input signal IN1. The voltage level of the boosting node BN might not be changed by the delay unit 461 and the capacitor 462 for the predetermined time tD2. Accordingly, the amount of the third current Ia may be reduced, but the amount of the fourth current Ib may be increased as indicated by a bolded arrow and thus the voltage level of the first output node ON1 may be boosted to a second boosting high level BH2. When the voltage level of the boosting node BN is changed to the high level according to the voltage level of the first output node ON1 after the predetermined time tD2, the amount of the third current Ia and the amount of the fourth current Ib may be the equilibrium state again and the voltage level of the first output node ON1 may be the steady state high level SH. As the voltage level of the first output node ON1 is boosted, the voltage level of the second output node ON2 may also be boosted to a second boosting low level BL2 and the output signal OUT having a low level peak PL2 may be generated. Because the boosting node BN is boosted through the capacitor 462 and the first input signal IN1, the second boosting high level BH2 may be larger than the first boosting high level BH1 illustrated in FIG. 3 and the low level peak PL2 of the output signal OUT may be smaller than the low level peak PL1 of the output signal OUT illustrated in FIG. 3.

When the first input signal IN1 is changed from the low level to the high level, the amount of the third current Ia may be increased and the voltage level of the first output node ON1 may be dropped, for example, to the steady state low level SL. At this time, the capacitor 462 may boost the voltage level of the boosting node BN to the high level. The voltage level of the boosting node BN might not be changed for the predetermined time tD2 by the delay unit 461 and the capacitor 462. Accordingly, the amount of the third current Ia may be increased, but the amount of the fourth current Ib may be reduced as indicated by a bolded arrow and the voltage level of the first output node ON1 may be boosted to the second boosting low level BL2. When the voltage level of the boosting node BN is changed to the low level according to the voltage level of the first output node ON1 after the predetermined time tD2, the amount of the third current Ia and the amount of the fourth current Ib may be the equilibrium state again and the voltage level of the first output node ON1 may be the steady state low level SL. As the voltage level of the first output node ON1 is boosted, the voltage level of the second output node ON2 may also be boosted to the second boosting high level BH2 and the output signal OUT having a high level peak PH2 may be generated. Because the boosting node BN is boosted through the capacitor 462 and the first input signal IN1, the second boosting low level BL2 may be smaller than the first boosting low level BL1 illustrated in FIG. 3 and the high level peak PH2 of the output signal OUT may be larger than the high level peak PH1 of the output signal OUT illustrated in FIG. 3.

Figure 6:
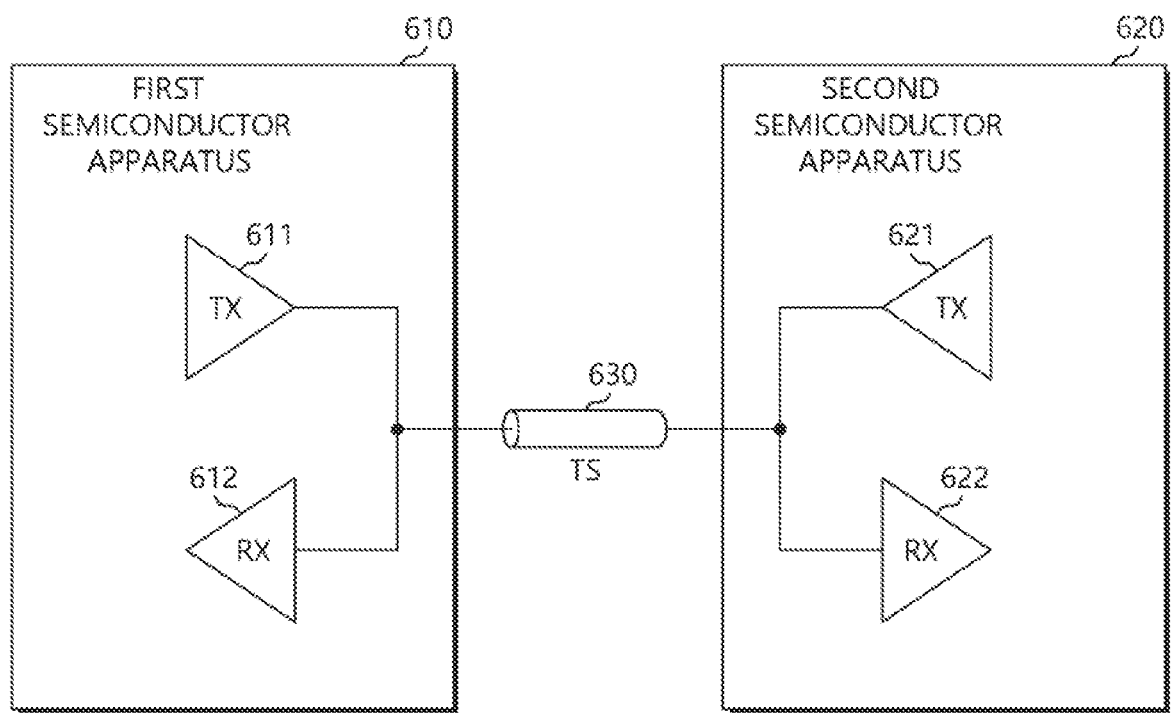
FIG. 6 shows a diagram illustrating a configuration of a semiconductor system, according to an embodiment of the present disclosure.

FIG. 6 shows a diagram illustrating a configuration of a semiconductor system 6, according to an embodiment. Referring to FIG. 6, the semiconductor system 6 may include a first semiconductor apparatus 610 and a second semiconductor apparatus 620. The first semiconductor apparatus 610 may provide various control signals required for the operation of the second semiconductor apparatus 620. The first semiconductor apparatus 610 may include various types of host apparatuses. For example, the first semiconductor apparatus 610 may be a host apparatus such as a central processing unit (CPU), a graphic processing unit (GPU), a multimedia processor (MMP), a digital signal processor (DSP), an application processor (AP), and a memory controller. The second semiconductor apparatus 620 may be, for example, a memory device, and the memory device may include a volatile memory and a nonvolatile memory. The volatile memory device may include a static random access memory (SRAM), a dynamic RAM (DRAM), a synchronous DRAM (SDRAM), and the like, and the nonvolatile memory device may include a read only memory (ROM), a programmable ROM (PROM), an electrically erase and programmable ROM (EEPROM), an electrically programmable ROM (EPROM), a flash memory, a phase-change RAM (PRAM), a magnetic RAM (MRAM), a resistive RAM (RRAM), a ferroelectric RAM (FRAM), and the like.

The second semiconductor apparatus 620 may be coupled to the first semiconductor apparatus 610 through a bus 630. The bus 630 may be a signal transfer path, a link, or a channel for transferring a signal TS. The bus 630 may be a unidirectional bus or a bidirectional bus. When the bus is the bidirectional bus, the first semiconductor apparatus 610 may transmit the signal TS to the second semiconductor apparatus 620 through the bus 630 or receive the signal TS transmitted from the second semiconductor apparatus 620 through the bus 630. The second semiconductor apparatus 620 may transmit the signal TS to the first semiconductor apparatus 610 through the bus 630 or receive the signal TS transmitted from the first semiconductor apparatus 610 through the bus 630. In an embodiment, the signal TS transmitted through the bus 630 may be a differential signal pair having a complementary relationship with each other. In an embodiment, the signal TS transmitted through the bus 630 may be a single-ended signal.

The first semiconductor apparatus 610 may include a transmitting circuit (TX) 611 and a receiving circuit (RX) 612. The transmitting circuit 611 may be coupled to the bus 630 and transmit the signal TS to the second semiconductor apparatus 620 by driving the bus 630 based on an internal signal of the first semiconductor apparatus 610. The receiving circuit 612 may be coupled to the bus 630 and receive the signal TS transmitted from the second semiconductor apparatus 620 through the bus 630. The receiving circuit 612 may generate the internal signal used in the inside of the first semiconductor apparatus 610 by performing differential amplification on the signal TS transmitted through the bus 630. The receiving circuit 612 may include the amplifier circuits 100, 200, and 400 illustrated in FIGS. 1, 2, and 4. The second semiconductor apparatus 620 may include a transmitting circuit (TX) 621 and a receiving circuit (RX) 622. The transmitting circuit 621 may be coupled to the bus 630 and transmit the signal TS to the first semiconductor apparatus 610 by driving the bus 630 based on an internal signal of the second semiconductor apparatus 620. The receiving circuit 622 may be coupled to the bus 630 and receive the signal TS transmitted from the second semiconductor apparatus 620 through the bus 630. The receiving circuit 622 may generate the internal signal used in the inside of the second semiconductor apparatus 620 by performing differential amplification on the signal transmitted through the bus 630. The receiving circuit 622 may include the amplifier circuits 100, 200, and 400 illustrated in FIGS. 1, 2, and 4.

Figure 7:
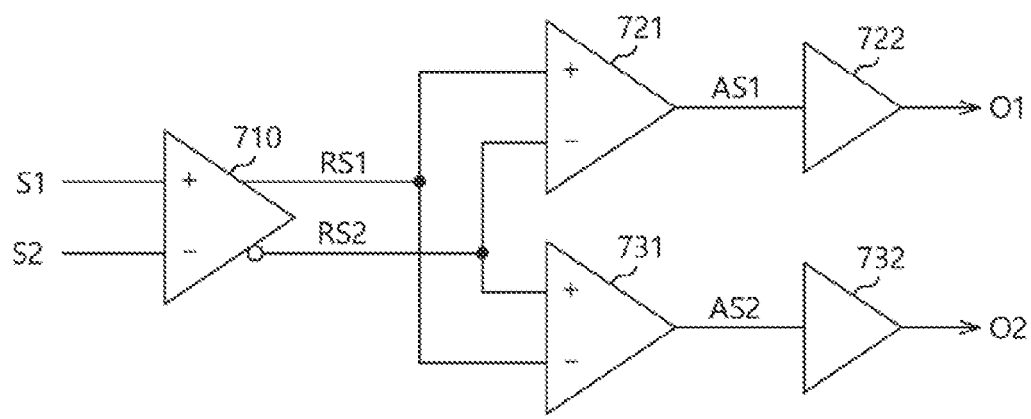
FIG. 7 shows a diagram illustrating a configuration of a receiving circuit, according to an embodiment of the present disclosure.

FIG. 7 shows a diagram illustrating a configuration of a receiving circuit 700, according to an embodiment. The receiving circuit 700 may be applied to the receiving circuits 612 and 622 illustrated in FIG. 6. Referring to FIG. 7, the receiving circuit 700 may include a receiver 710, a first amplifier 721, a first buffer 722, a second amplifier 731, and a second buffer 732. The receiver 710 may receive a first signal S1 and a second signal S2. The second signal S2 may be a complementary signal of the first signal S1 and the first and second signals S1 and S2 may be a differential signal pair. In an embodiment, the first signal S1 may be a single-ended signal, and the second signal S2 may be a reference voltage having a voltage level corresponding to a middle level of a swing range of the first signal S1. The receiver 710 may output a first receiving signal RS1 and a second receiving signal RS2 by performing differential amplification on the first and second signals S1 and S2. The amplifier circuits 100, 200, and 400 illustrated in FIGS. 1, 2, and 4 may be applied to the receiver 710.

The first amplifier 721 may receive the first and second receiving signals RS1 and RS2 and output a first amplification signal AS1. The first amplifier 721 may generate the first amplification signal AS1 by performing differential amplification on the first and second receiving signals RS1 and RS2. The amplifier circuits 100, 200, and 400 illustrated in FIGS. 1, 2, and 4 may be applied to the first amplifier 721. The first buffer 722 may generate a first output signal O1 by buffering the first amplification signal AS1. The first amplifier 721 may boost the level of the first amplification signal AS1 by increasing an AC gain when the levels of the first and second receiving signals RS1 and RS2 are changed and allow the first amplification signal AS1 to have a high or low level peak. Accordingly, the first buffer 722 may generate the first output signal O1 having an accurate level by buffering the boosted first amplification signal AS1.

The second amplifier 731 may receive the second and first receiving signals RS2 and RS1 and output a second amplification signal AS2. The second amplifier 731 may generate the second amplification signal AS2 by performing differential amplification on the second and first receiving signals RS2 and RS1. The amplifier circuits 100, 200, and 400 illustrated in FIGS. 1, 2, and 4 may be applied to the second amplifier 731. The second buffer 732 may generate a second output signal O2 by buffering the second amplification signal AS2. The second amplifier 731 may boost the level of the second amplification signal AS2 by increasing an AC gain when the levels of the second and first receiving signals RS2 and RS1 are changed and allow the second amplification signal AS2 to have a high or low level peak. Accordingly, the second buffer 732 may generate the second output signal O2 having an accurate level by buffering the boosted second amplification signal AS2.

The above described embodiments of the present invention are intended to illustrate and not to limit the present teachings. Various alternatives and equivalents are possible. The present teachings not limited by the embodiments described herein. Nor are the present teachings limited to any specific type of semiconductor apparatus. Other additions, subtractions, or modifications are obvious in view of the present disclosure and are intended to fall within the scope of the appended claims.

What is claimed is:

1. A semiconductor integrated circuit device, comprising:
a first input unit configured to change a voltage level of a first output node based on a first input signal;
a second input unit configured to change a voltage level of a second output node based on a second input signal;
a first current driver configured to supply a first current to the first output node based on a voltage level of a boosting node;
a gain booster configured to change the voltage level of the boosting node based on the voltage level of the first output node and configured to change the voltage level of the boosting node after a predetermined time when the voltage level of the first output node is changed;
a capacitor configured to be connected between an input terminal of the first input unit and the boosting node; and
a second current driver configured to supply a second current to the second output node based on the voltage level of the first output node.

2. The semiconductor integrated circuit device of claim 1, wherein the second input signal is a complementary signal of the first input signal.

3. The semiconductor integrated circuit device of claim 1, wherein the gain booster includes a resistor electrically coupled between the first output node and the boosting node.

4. A semiconductor integrated circuit device connected between a first power voltage terminal and a second power terminal, comprising:
a first current transistor configured to selectively connect between the first power terminal and a first output node based on a voltage level of the first output node;
a second current transistor configured to selectively connect between the first power terminal and a second output node based on a voltage level of the first output node;
a first input transistor configured to selectively connect the first output node and the second power terminal based on a first input signal;
a second input transistor configured to selectively connect the second output node and the second power terminal based on a second input signal; and
a gain booster configured to receive the first input signal and delay the voltage level of the first output node thereby driving the first current transistor later than the second current transistor.

5. The semiconductor integrated circuit device of claim 4, wherein a gate of the first current transistor and the gate of the second current transistor are electrically connected by an interconnection line.

6. The semiconductor integrated circuit device of claim 5, wherein the gain booster is connected between a boosting node and a first node,
wherein the boosting node and the first node are on the interconnection line.

7. The semiconductor integrated circuit device of claim 6, wherein the first node is electrically connected to the first out node.

8. The semiconductor integrated circuit device of claim 6, wherein the gate of the first input transistor is electrically connected to the boosting node.

9. The semiconductor integrated circuit device of claim 6, wherein the gain booster includes a resistor connected between the first node and the boosting node.

10. The semiconductor integrated circuit device of claim 6, wherein the gain booster further includes a capacitor between the boosting node and the gate of the first node.

11. The semiconductor integrated circuit device of claim 6, further comprising an enable transistor configured to selectively connect between the first and second input transistors and the second power terminal based on an enable signal.

12. A semiconductor integrated circuit device connected between a first power voltage terminal and a second power terminal, comprising:
a first current transistor configured to selectively connect between the first power terminal and a first output node based on a voltage level of the first output node;
a second current transistor configured to selectively connect between the first power terminal and a second output node based on a voltage level of the first output node;
a first input transistor configured to selectively connected the first output node and the second power terminal based on a first input signal;
a second input transistor configured to selectively connected the second output node and the second power terminal based on a second input signal; and
a gain booster configured to receive the first input signal and delay the voltage level of the first output node thereby driving the first current transistor later than the second current transistor,
wherein the first current transistor is independently driven from the voltage level of the second output node.

* * * * *